United States Patent
Zhao et al.

(10) Patent No.: US 8,142,219 B1
(45) Date of Patent: Mar. 27, 2012

(54) ELECTRONIC DEVICE HAVING A CASING WITH A HOLDER BETWEEN A SUBSTRATE AND A FEMALE CONNECTOR

(75) Inventors: Ting-Ting Zhao, Shenzhen (CN); Xiao-Hui Zhou, Shenzhen (CN); Min-Li Li, Shenzhen (CN); Hong Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/048,954

(22) Filed: Mar. 16, 2011

(30) Foreign Application Priority Data

Dec. 1, 2010 (CN) .......................... 201010568056.9

(51) Int. Cl.
*H01R 13/62* (2006.01)

(52) U.S. Cl. ...................................................... 439/367
(58) Field of Classification Search .................. 439/367, 439/79, 587, 271, 660
See application file for complete search history.

(56) References Cited

U.S. PATENT DOCUMENTS

| | | | | |
|---|---|---|---|---|
| 5,256,072 A | * | 10/1993 | Hatagishi | 439/79 |
| 6,246,578 B1 | * | 6/2001 | Wei et al. | 361/679.4 |
| 6,547,591 B2 | * | 4/2003 | Okabe et al. | 439/557 |
| 7,407,404 B2 | * | 8/2008 | Reid | 439/367 |
| 7,575,454 B1 | * | 8/2009 | Aoki et al. | 439/188 |
| 7,611,359 B2 | * | 11/2009 | Tomizu et al. | 439/74 |
| 7,926,965 B2 | * | 4/2011 | Cho et al. | 362/97.1 |

* cited by examiner

*Primary Examiner* — Chandrika Prasad
(74) *Attorney, Agent, or Firm* — Altis Law Group, Inc.

(57) ABSTRACT

An electronic device includes a casing, a female connector received in the casing and a holder. The casing has a substrate. The female connector is spaced from an inner surface of the casing. The female connector defines an opening in one end thereof for a male connector inserting therein. The holder is between the substrate of the casing and the other end of the female connector which is away from the opening.

9 Claims, 4 Drawing Sheets

ELECTRONIC DEVICE HAVING A CASING WITH A HOLDER BETWEEN A SUBSTRATE AND A FEMALE CONNECTOR

BACKGROUND

1. Technical Field

The present disclosure relates to electronic devices and, more particularly, to an electronic device for protecting a connector accommodated therein.

2. Description of Related Art

An electronic device usually includes a main board, a battery module, and a bus connector electrically connected to the main board and the battery module. The main board and the battery module each include a female connector. The bus connector has two male connectors arranged at two ends thereof which are inserted into the female connectors of the main board and the battery module, respectively, electrically connecting the main board to the battery module. However, the female connector of the battery module is spaced from an inner surface of the casing, and so the connector is not supported on one side making it easy to deform and thus become loose when the male connector is inserted in it. Furthermore, dust can enter a space defined between the end of the female connector and the casing.

Therefore, what is needed is an electronic device, which can overcome the above described shortcomings.

DETAILED DESCRIPTION

Figure 1:
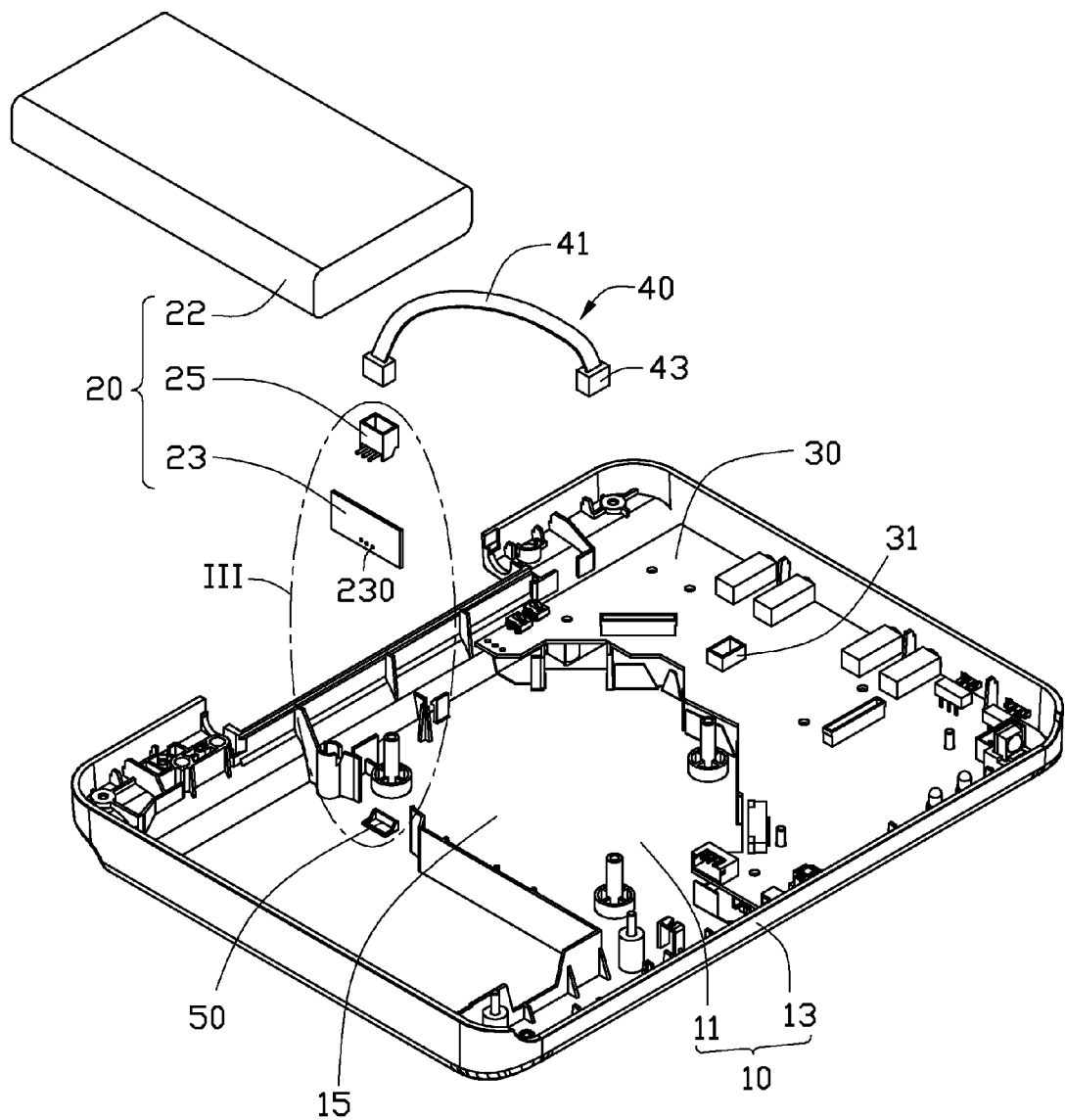
FIG. 1 is an exploded, isometric view of an electronic device in accordance with an exemplary embodiment of the present disclosure.
Figure 2:
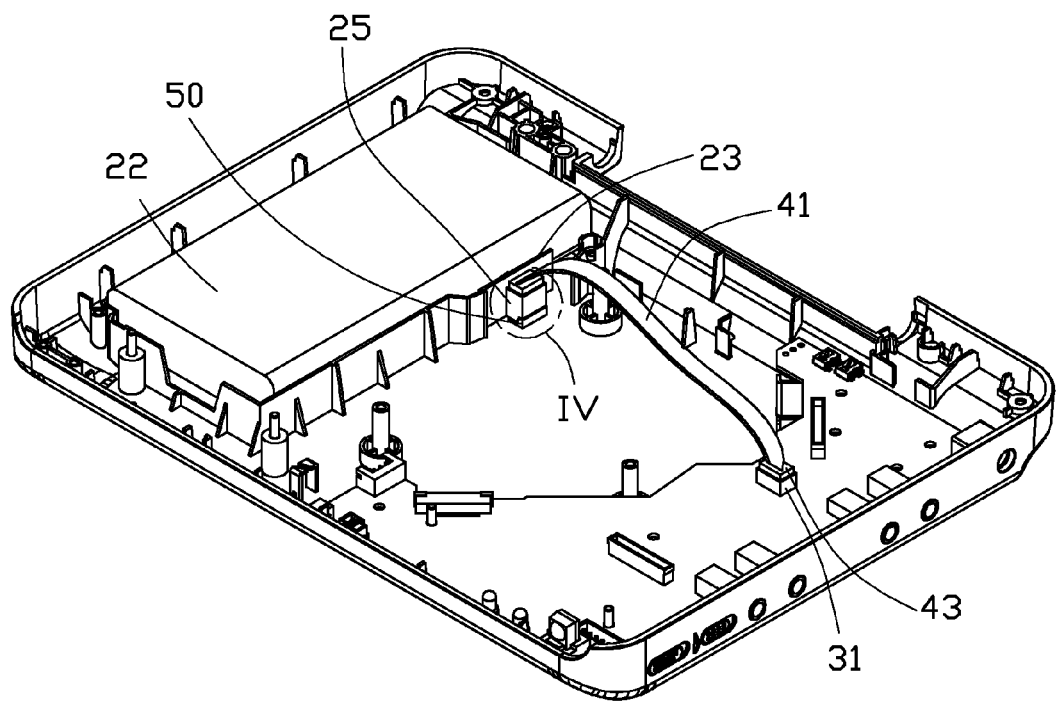
FIG. 2 is an assembled, isometric view of the electronic device of FIG. 1.
Figure 3:
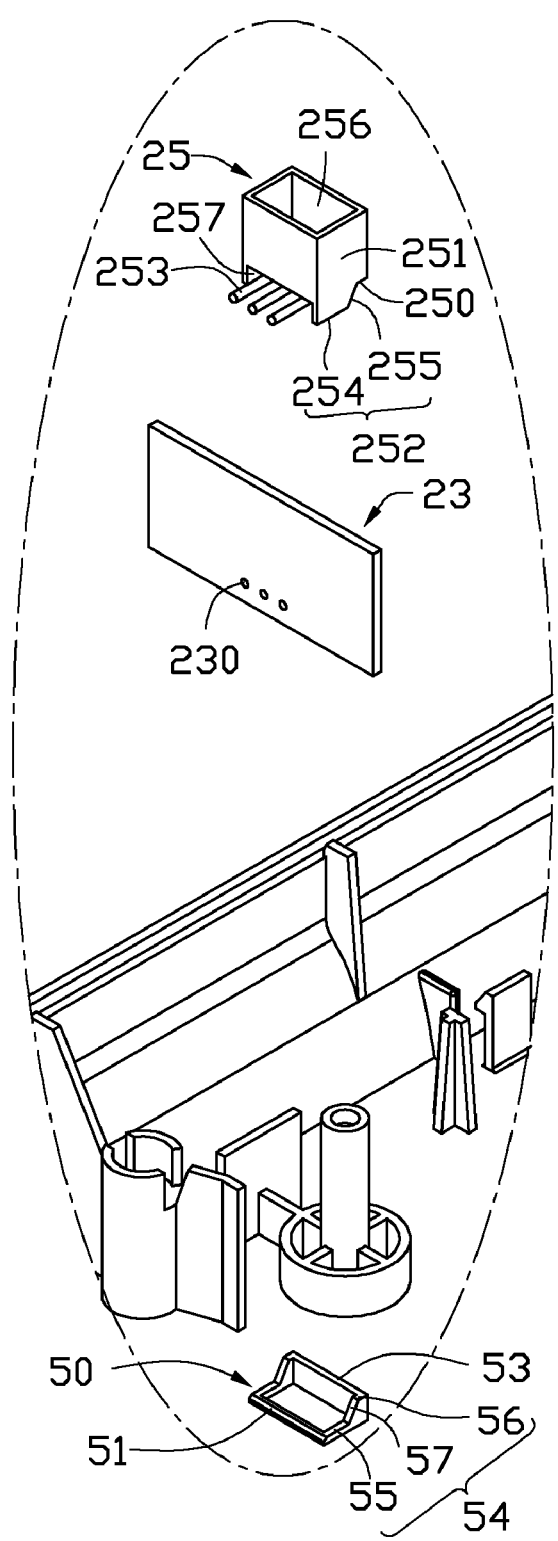
FIG. 3 is an enlarged view of a portion III of FIG. 1.

Referring to FIGS. 1 to 3, an electronic device, in accordance with an exemplary embodiment is shown. The electronic device includes a casing 10, a battery module 20, and a main board 30 received in the casing 10, and a bus connector 40 and a holder 50 for electrically connecting the battery module 20 to the main board 30.

The casing 10 includes a substrate 11, a sidewall 13 perpendicularly extending up from a peripheral edge of the substrate 11, and a cover (not shown) covering the sidewall 13. The substrate 11, the sidewall 13, and the cover cooperatively define a chamber 15 for receiving the battery module 20 and the main board 30.

The battery module 20 includes a battery 22, a protected board 23 arranged at one side of the battery 22, and a female connector 25. The female connector 25 includes a hollow rectangular body 251, two fixing plates 252 extending down from two opposite sides of a bottom surface 250 of the body 251, and a plurality of terminals 253 extending out and horizontally from the bottom surface 250 of the body 251. An upper portion of the body 251 defines an opening 256. The protected board 23 defines a plurality of through holes 230 for respectively receiving the terminals 253. Each fixing plate 252 includes a planar surface 254 parallel to the bottom surface 250 of the body 251, and a slanted surface 255 connected between the bottom surface 250 of the body 251 and the planar surface 254.

A power socket 31 is arranged on the main board 30 corresponding to the female connector 25 of the battery module 20. The bus connector 40 includes a cable 41 having a plurality of electrical lines, and two male connectors 43 mounted on two opposite ends of the cable 41. The male connectors 43 are respectively inserted into the female connector 25 and the power socket 31, for electrically connecting the battery module 20 to the main board 30.

The holder 50 is arranged on one side of the protected board 23, which is away from the battery 22. The holder 50 includes a first supporting wall 51, a second supporting wall 53 opposite and parallel to the first supporting wall 51, and two connecting arms 54 connected between the first supporting wall 51 and the second supporting wall 53. A top of the second supporting wall 53 is higher than that of the first supporting wall 51. Each connecting arm 54 includes a first connecting portion 55 adjacent to the first supporting wall 51, a second connecting portion 56 adjacent to the second supporting wall 53, and a slanted portion 57 slantingly connected between the first connecting portion 55 and the second connecting portion 56. A top of the second connecting portion 56 is higher than that of the first connecting portion 55. In the present embodiment, the holder 50 is integrally formed with the substrate 11 as a single piece.

Figure 4:
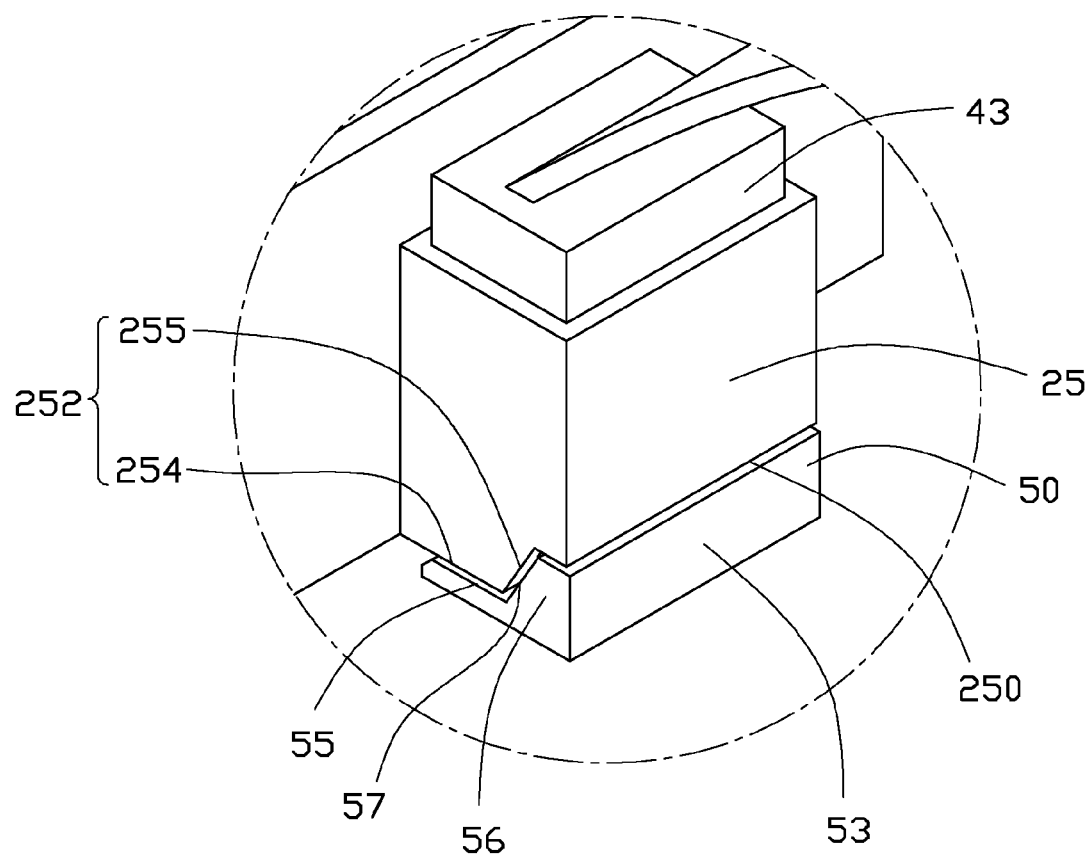
FIG. 4 is an enlarged view of a portion IV of FIG. 2.

Referring to FIG. 4, in assembly of the electronic device, the female connector 25 is mounted on the protected board 23 with the terminals 253 extending through a notch 257 defined by a bottom portion of the female connector 25 and into the through holes 230 of the protected board 23 to connect to the battery 22. The female connector 25 is seated in the holder 50. The slanted surface 255 of the fixing plate 252 matches the slanted portion 57 of the connecting arm 54; the planar surface 254 of the fixing plate 252 contacts to the first connecting portion 55 of the connecting arm 54; the bottom surface 250 of the body 251 matches an upper portion of the second supporting wall 53 of the holder 50; therefore, a bottom portion of the female connector 25 tightly contacts with the substrate 11 by the holder 50.

The two male connectors 43 of the bus connector 40 are inserted into the body 251 of the female connector 25 and the power socket 31 of the main board 30, respectively. The direction of pressing force when the male connector 43 is inserted into the female connector 25 is perpendicular to the extending direction of the terminals 253. The holder 50 supports the female connector 25 and is between the bottom of the female connector 25 and the substrate 11; therefore, it can prevent the terminals 253 of the female connector 25 from deforming. Furthermore, the bottom portion of the female connector 25 tightly contacts with the holder 50 and the opposite side of the holder 50 tightly contacts the substrate 11, to thereby prevent dust from entering a space defined between the end of the female connector 25 and the substrate 11 of the casing 10.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. An electronic device, comprising:
   a casing having a substrate;

a female connector spaced from the substrate of the casing, the female connector defining an opening in one end thereof for a male connector inserting therein; and a holder supported between the substrate of the casing and the other end of the female connector which is away from the opening, the holder being coupled to the other end of the female connector to thereby prevent dust from entering a space defined between the other end of the female connector and the substrate of the casing.

2. The electronic device of claim 1, wherein the female connector comprises a body and a plurality of terminals extending out and horizontally from the body, the opening of the female connector being in an upper portion of the body, the terminals extending out from a bottom portion of the body, the holder and the female connector cooperatively defining a receiving space having a notch for the terminals extending out of the female connector.

3. The electronic device of claim 2, wherein the female connector further comprises two fixing plates extending down from two opposite sides of a bottom surface of the body, the holder being connected between the fixing plates of the female connector and the substrate of the casing.

4. The electronic device of claim 3, wherein the holder comprises a first supporting wall, a second supporting wall, and two connecting arms connected between the first supporting wall and the second supporting wall, an upper portion of the connecting arm contacting to the fixing plate, the second supporting wall matching the bottom portion of the body, the notch being defined at a bottom portion of the body.

5. The electronic device of claim 4, wherein the fixing plate comprises a planar surface and a slanted surface, a height of the second supporting wall being higher than that of the first supporting wall, the connecting arm comprising a first connecting portion adjacent to the first supporting wall and compliant to the planar surface of the fixing plate, a second connecting portion adjacent to the second supporting wall, and a slanted portion inclined connected between the first connecting portion and the second connecting portion, the slanted portion matching the slanted surface of the fixing plate.

6. An electronic device, comprising:

a casing having a substrate;

a female connector spaced from the substrate of the casing, the female connector comprising a body and a plurality of terminals extending out and horizontally from the body, the body of the female connector defining an opening in one end thereof for a male connector inserting therein; and a holder supported between the substrate of the casing and the other end of the female connector which is away from the opening, the holder and the female connector cooperatively defining a receiving space having a notch for the terminals extending out of the female connector.

7. The electronic device of claim 6, wherein the holder is integrally formed with the substrate of the casing.

8. The electronic device of claim 6, wherein the opening is defined at an upper portion of the body, the terminals extending out from a bottom portion of the body, the female connector further comprising a fixing plate extending down from a bottom portion of the body, the holder being connected to the fixing plate and the casing.

9. The electronic device of claim 8, wherein the fixing plate comprises a planar surface and a slanted surface, the holder comprising a first supporting wall, a second supporting wall, two connecting arms connecting to the first supporting wall and the second supporting wall, each connecting arm comprising a slanted portion matching the slanted surface of the fixing plate.

\* \* \* \* \*